United States Patent
Ogawa et al.

(10) Patent No.: US 10,930,689 B2
(45) Date of Patent: Feb. 23, 2021

(54) PHOTOELECTRIC CONVERSION APPARATUS AND EQUIPMENT

(71) Applicant: CANON KABUSHIKI KAISHA, Tokyo (JP)

(72) Inventors: Toshiyuki Ogawa, Abiko (JP); Hajime Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 16/006,136

(22) Filed: Jun. 12, 2018

(65) Prior Publication Data

US 2018/0366505 A1 Dec. 20, 2018

(30) Foreign Application Priority Data

Jun. 20, 2017 (JP) .............................. JP2017-120763

(51) Int. Cl.
*H01L 27/146* (2006.01)
*H04N 5/361* (2011.01)
*H04N 5/374* (2011.01)

(52) U.S. Cl.
CPC .... *H01L 27/14623* (2013.01); *H01L 27/1461* (2013.01); *H01L 27/1463* (2013.01); *H01L 27/14614* (2013.01); *H01L 27/14636* (2013.01); *H01L 27/14641* (2013.01); *H01L 27/14643* (2013.01); *H01L 27/14685* (2013.01); *H01L 27/14689* (2013.01); *H04N 5/361* (2013.01); *H04N 5/374* (2013.01)

(58) Field of Classification Search
CPC ........... H01L 27/14623; H01L 27/1461; H01L 27/14614; H01L 27/1463; H01L 27/14636; H01L 27/14641; H01L 27/14643; H01L 27/14685; H01L 27/14689; H04N 5/361; H04N 5/374
See application file for complete search history.

(56) References Cited

U.S. PATENT DOCUMENTS

| | | | |
|---|---|---|---|
| 2002/0125513 A1* | 9/2002 | Inoue | H01L 27/14609 257/291 |
| 2011/0248371 A1 | 10/2011 | Matsumura et al. | |
| 2012/0300106 A1 | 11/2012 | Kobayashi et al. | |
| 2017/0077161 A1* | 3/2017 | Suzuki | H01L 27/14625 |

FOREIGN PATENT DOCUMENTS

JP 2016-219792 A 12/2016

* cited by examiner

*Primary Examiner* — Fernando L Toledo
*Assistant Examiner* — Neil R Prasad
(74) *Attorney, Agent, or Firm* — Canon U.S.A., Inc. I.P. Division

(57) ABSTRACT

A photoelectric conversion apparatus includes a semiconductor layer including a photoelectric conversion portion, a charge holding portion configured to hold electric charge generated from the photoelectric conversion portion, and a charge detection portion to which the electric charge held by the charge holding portion is transferred. A gate electrode of a transistor and a light shielding film including a first portion covering the charge holding portion and a second portion covering an upper surface of the gate electrode are disposed above the semiconductor layer. The distance between the second portion of the light shielding film and the upper surface of the gate electrode is greater than the distance between the first portion of the light shielding film and the semiconductor layer.

19 Claims, 5 Drawing Sheets

PHOTOELECTRIC CONVERSION APPARATUS AND EQUIPMENT

BACKGROUND OF THE INVENTION

Field of the Invention

The present disclosure generally relates to a photoelectric conversion apparatus including a light shielding film.

Description of the Related Art

Complementary metal-oxide semiconductor (CMOS) image sensors include a charge holding portion for holding electric charge generated in a photoelectric conversion portion to achieve a global electronic shutter function. The charge holding portion is covered with a light shielding film to prevent light from entering the charge holding portion while holding electric charge.

Japanese Patent Laid-Open No. 2016-219792 discloses that a light shielding member covers a charge holding portion and gate electrodes of transistors of a pixel circuit. When the light shielding film is increased in area or is disposed close to the semiconductor layer to increase the light shielding performance, parasitic capacitance due to the light shielding film is likely to be added to the gate electrode. The present inventors have newly found that the parasitic capacitance due to the light shielding film affects the operation of the pixel circuit to interfere with an improvement in the function of the photoelectric conversion apparatus. The present disclosure improves the performance of the photoelectric conversion apparatus.

SUMMARY OF THE INVENTION

In a first aspect of the present disclosure, a photoelectric conversion apparatus includes a semiconductor layer, a gate electrode of a transistor, and a light shielding film. The semiconductor layer includes a photoelectric conversion portion, a charge holding portion configured to hold electric charge generated in the photoelectric conversion portion, and a charge detection portion to which the electric charge held by the charge holding portion is transferred. The gate electrode is disposed on the semiconductor layer. The light shielding film includes a first portion covering the charge holding portion and a second portion covering an upper surface of the gate electrode. The distance between the second portion and the upper surface is greater than the distance between the first portion and the semiconductor layer.

In a second aspect of the present disclosure, a photoelectric conversion apparatus includes a semiconductor layer, a gate electrode of a transistor, and a light shielding film. The semiconductor layer includes a photoelectric conversion portion, a charge holding portion configured to hold electric charge generated by the photoelectric conversion portion, and a charge detection portion to which the electric charge held by the charge holding portion is transferred. The gate electrode is disposed on the semiconductor layer and has an upper surface and a side face. The light shielding film includes a first portion covering the charge holding portion, a second portion covering the upper surface of the gate electrode, and a third portion covering a source or a drain of the transistor. The distance between the second portion and the upper surface is greater than the distance between the third portion and the semiconductor layer.

Further features of the present disclosure will become apparent from the following description of exemplary embodiments with reference to the attached drawings.

DESCRIPTION OF THE EMBODIMENTS

Embodiments of the present disclosure will be described hereinbelow with reference to the drawings. Like configurations across a plurality of drawings are given like reference signs in the following description and drawings. For that reason, like configurations will be described with reference to a plurality of drawings, and descriptions of configurations denoted by the same signs will be omitted herein as appropriate.

Configurations with the same name and different signs can be distinguished as, for example, a first configuration, a second configuration, a third configuration, and so on.

First Embodiment

Figure 1A:
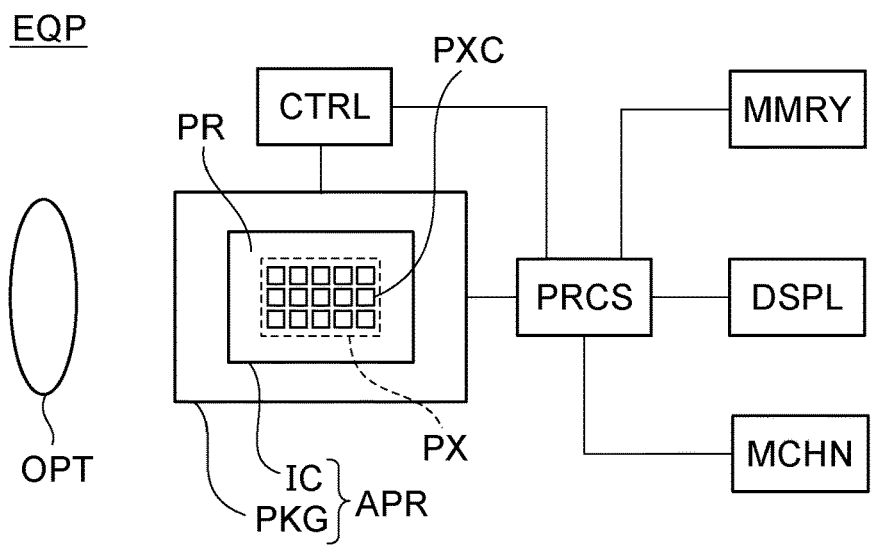
FIG. 1A is a schematic diagram of equipment including a photoelectric conversion apparatus according to a first embodiment of the present disclosure.

FIG. 1A is a schematic diagram of equipment EQP including a photoelectric conversion apparatus APR according to an embodiment of the present disclosure. The photoelectric conversion apparatus APR includes a semiconductor device IC. The semiconductor device IC is a semiconductor chip including a semiconductor integrated circuit. In addition to the semiconductor device IC, the photoelectric conversion apparatus APR can include a package PKG for holding the semiconductor device IC. The photoelectric conversion apparatus APR can be used as an image sensor, an auto focus (AF) sensor, a photometric sensor, or a range sensor.

The equipment EQP further includes at least one of an optical system OPT, a control unit CTRL, a processing unit PRCS, a display unit DSPL, a memory MMRY, and a mechanical unit MCHN. The details of the equipment EQP will be described later.

The semiconductor device IC includes a pixel region PX in which pixel circuits PXC each including a photoelectric conversion portion are arrayed in two dimensions. The semiconductor device IC can include a peripheral region PR around the pixel region PX. The peripheral region PR may be provided with driving circuits for driving the pixel circuits PXC, signal processing circuits for processing signals from the pixel circuits PXC, and control circuits for controlling the driving circuits and the signal processing circuits. The signal processing circuit can perform signal processing, for example, a correlated double sampling (CDS) process, an amplifying process, and an analog-to-digital (AD) conversion process. Another example of the semiconductor device IC has a multi-layer structure in which a semiconductor layer including at least part of peripheral circuits in the peripheral region PR and a semiconductor layer including the pixel region PX are layered.

Figure 1B:
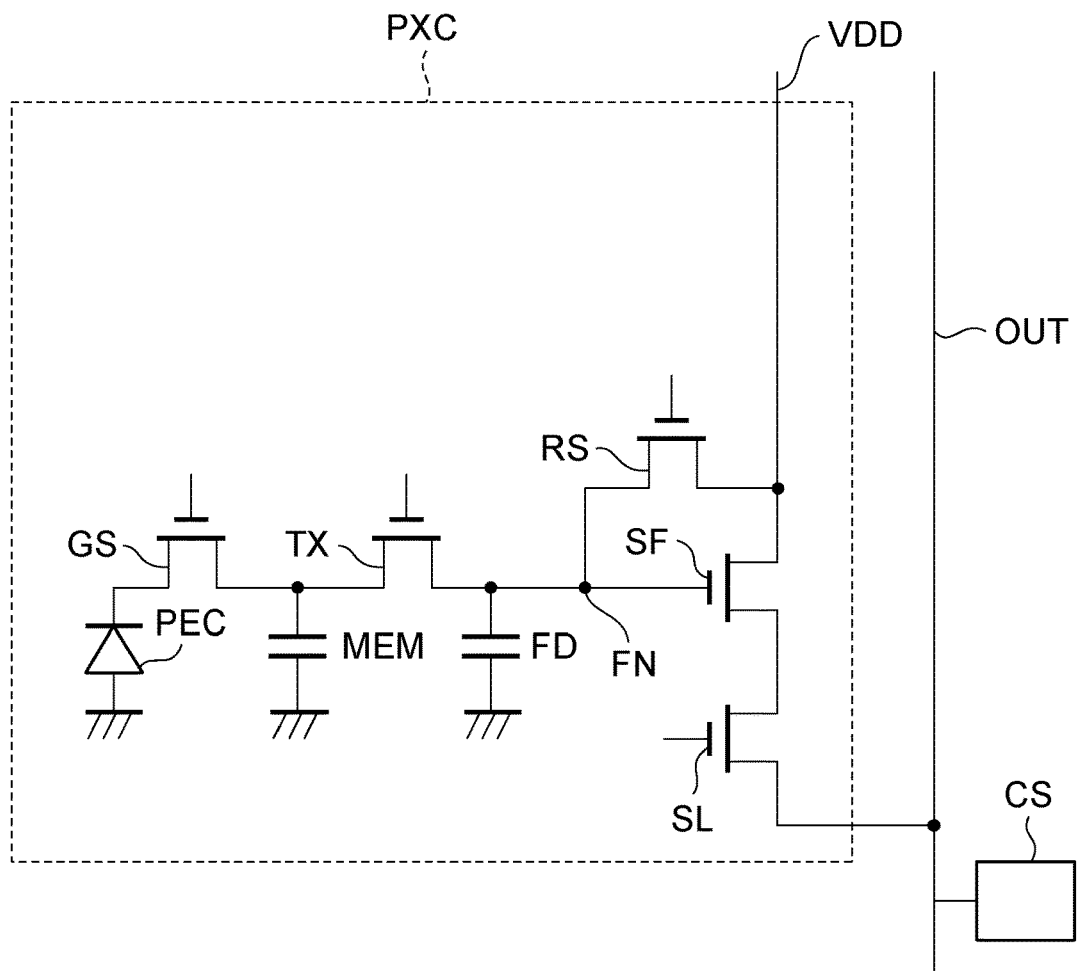
FIG. 1B illustrates an example of each pixel circuit.

FIG. 1B illustrates an example of each pixel circuit PXC. The pixel circuit PXC includes a photoelectric conversion element PEC, a transfer gate GS, a charge holding capacitor MEM, a transfer gate TX, and a charge detection capacitor FD. The pixel circuit PXC can further include an amplifying transistor SF, a reset transistor RS, and a selection transistor SL. The photoelectric conversion element PEC is a photodiode or a photogate. The charge detection capacitor FD is a floating diffusion capacitor. The transfer gates GS and TX are metal-insulator-semiconductor (MIS) gates. The amplifying transistor SF, the reset transistor RS, and the selection transistor SL are MIS transistors. The amplifying transistor SF may be a junction field-effect transistor. A plurality of photoelectric conversion elements PEC can also share one amplifying transistor SF.

A signal charge generated from the photoelectric conversion element PEC is transferred to the charge holding capacitor MEM through the transfer gate GS, and the charge holding capacitor MEM holds the charge generated by the photoelectric conversion element PEC. The signal charge held by the charge holding capacitor MEM is transferred to the charge detection capacitor FD through the transfer gate TX. The charge detection capacitor FD is connected to a floating node FN. The gate of the amplifying transistor SF that constitutes a source follower circuit together with the current source CS is connected to the floating node FN. In other words, the gate of the amplifying transistor SF is connected to the charge detection capacitor FD via the floating node FN. A pixel signal, which is a voltage signal, is output to a signal output line OUT. The reset transistor RS resets the electric charge and the potential of the floating node FN. The selection transistor SL switches connections between the amplifying transistor SF and the signal output line OUT. The reset transistor RS and the amplifying transistor SF are connected to a power supply line VDD. The signal output line OUT and the power supply line VDD are provided for each column of the pixel circuits PXC.

Figure 2A:
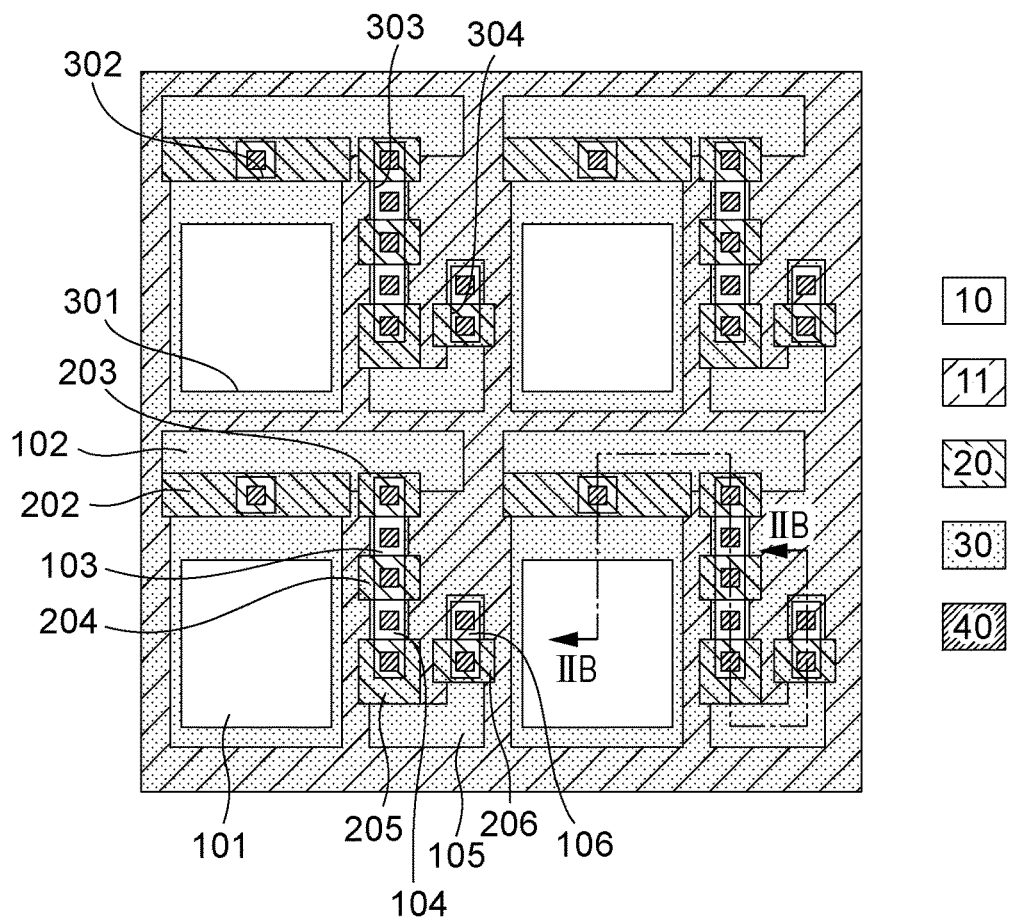
FIG. 2A is a schematic plan view of the pixel circuits.
Figure 2B:
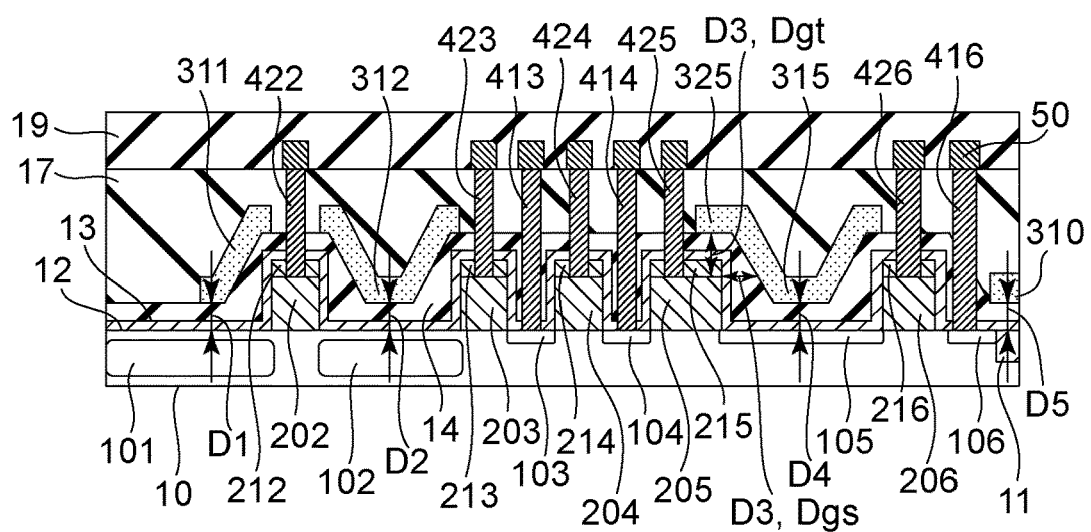
FIG. 2B is a schematic cross-sectional view of the pixel circuits taken along line IIB-IIB in FIG. 2A.

FIG. 2A is a schematic plan view of the pixel circuits PXC. FIG. 2B is a schematic cross-sectional view of the pixel circuits PXC taken along line IIB-IIB in FIG. 2A. FIG. 2A illustrates pixel circuits PXC corresponding to four (2×2) pixels. The four pixel circuits PXC are translationally symmetrical. For high visibility, signs representing different items are provided in different pixels. Legends illustrating the correspondence relationship between hatching and signs are illustrated at the right of FIG. 2A and the lower part of FIG. 2B. FIG. 2A illustrates how a plurality of members overlap using overlaps of the hatched portions.

The photoelectric conversion apparatus APR includes a semiconductor layer 10, gate electrodes 20 of the transistors, which are disposed on the semiconductor layer 10, and a light shielding film 30 disposed above the semiconductor layer 10.

The semiconductor layer 10 is, for example, an epitaxial layer on a single-crystal silicon wafer. The semiconductor layer 10 includes semiconductor regions defined by an element isolation region 11. The semiconductor layer 10 includes a photoelectric conversion portion 101, a charge holding portion 102, a charge detection portion 103, each of which is a semiconductor region. The semiconductor layer 10 includes n-type semiconductor regions 104, 105, and 106 each of which functions as the source and/or drain of each transistor. Semiconductor regions serving as channel regions are provided between the photoelectric conversion portion 101, the charge holding portion 102, the charge detection portion 103, and the semiconductor regions 104, 105, and 106. For example, in FIG. 2A, the photoelectric conversion portion 101, the charge holding portion 102, the charge detection portion 103, and the semiconductor regions 104, 105, and 106 are n-type semiconductor regions, and the other semiconductor regions of the semiconductor layer 10 are p-type semiconductor regions. In the following description, a conductivity type in which an electric charge that is treated as a signal charge in the pixel circuits PXC is a majority carrier is referred to as a first conductivity type, and a conductivity type in which an electric charge that is treated as a signal charge is a minority carrier is referred to as a second conductivity type. In the case where electrons are used as a signal charge, the n-type is the first conductivity type, and the p-type is the second conductivity type.

The photoelectric conversion portion 101 corresponds to the photoelectric conversion element PEC, the charge holding portion 102 corresponds to the charge holding capacitor MEM, and the charge detection portion 103 corresponds to the charge detection capacitor FD. The charge detection portion 103 is an n-type semiconductor region serving as floating diffusion. The photoelectric conversion portion 101 includes an n-type semiconductor region serving as a charge accumulation region. Between the n-type semiconductor region of the photoelectric conversion portion 101 and the surface of the semiconductor layer 10 is provided with a p-type semiconductor region. The p-type semiconductor region on the photoelectric conversion portion 101 suppresses the incorporation of a noise charge (dark current) generated on the surface of the semiconductor layer 10 into the n-type semiconductor region of the photoelectric conversion portion 101. The charge holding unit 102 includes an n-type semiconductor region serving as a charge holding region. Between the n-type semiconductor region of the charge holding unit 102 and the surface of the semiconductor layer 10 is provided with a p-type semiconductor region. The p-type semiconductor region on the charge holding unit 102 suppresses the incorporation of a noise charge (dark current) generated on the surface of the semiconductor layer 10 into the n-type semiconductor region of the charge holding unit 102.

A plurality of gate electrodes 20 are provided on the semiconductor regions serving as channel regions. The gate electrodes 20 are, for example, polysilicon electrodes. Part or all of the gate electrodes 20 may be made of metal or a metal compound. The plurality of gate electrodes 20 include gate electrodes 202, 203, 204, and 205, 206. The gate electrode 202 constitutes the transfer gate GS, and the gate electrode 203 constitutes the transfer gate TX. Therefore, the gate electrodes 202 and 203 can also be referred to as transfer electrodes. The gate electrode 204 constitutes the reset transistor RS. The gate electrode 205 constitutes the amplifying transistor SF. The gate electrode 206 constitutes the selection transistor SL. The semiconductor region 104 functions as the drain of the amplifying transistor SF. The semiconductor region 105 functions as the source of the amplifying transistor SF. The semiconductor region 106 functions as the source of the selection transistor SL.

The light shielding film 30 is a metal film that is made mainly from metal, such as tungsten. The light shielding film 30 is, for example, from 110 nm to 240 nm in thickness. As illustrated in FIG. 2A, although the light shielding film 30 includes openings 301, 302, 303, and 304, the light shielding film 30 covers most of the pixel circuits PXC. The opening 301 is located above the photoelectric conversion portion 101, and the opening 302 is located above the gate electrode 202. The photoelectric conversion portion 101 can receive light through the opening 301. The opening 303 is located above the gate electrode 203, the charge detection portion 103, the semiconductor region 104, and the gate electrode 205. The opening 304 is located above the gate electrode 206 and the semiconductor region 106. As illustrated in FIG. 2A, the light shielding film 30 include portions that cover the charge holding portions 102 and portions that cover the gate electrodes 20. In addition, the light shielding film 30 further includes portion that cover the semiconductor regions of the transistor, portions that cover part of the photoelectric conversion portions 101, and portions that cover the element isolation regions 11. FIG. 2B illustrates, of the light shielding film 30, a portion 311 that covers the photoelectric conversion portion 101, a portion 312 that covers the charge holding portion 102, a portion 325 that covers the gate electrode 205, a portion 315 that covers the semiconductor region 105, and a portion 310 that covers the element isolation region 11. The fact that the light shielding film 30 includes the portions that cover the semiconductor regions indicates that the light shielding film 30 is contiguous between the portions that cover the semiconductor regions.

The present embodiment provides a device for optimizing the electrostatic capacitance between the light shielding film 30 and the gate electrodes 20 (the details will be described later). This electrostatic capacitance is also referred to as parasitic capacitance. The parasitic capacitance due to the light shielding film 30 affects the operation of the pixel circuits PXC, interfering with improvement in the performance of the photoelectric conversion apparatus APR. In particular, the capacitance of the charge detection capacitor FD is a conversion factor (gain) of charge-voltage conversion (V=Q/C) at the input of the amplifying transistor SF and is an important factor in improving the performance of the pixel circuit PXC. Decreasing the capacitance of the charge detection capacitor FD to increase the conversion factor can enhance the gradation of signals at low luminance and reduce dark noise. This also improves the signal to noise (S/N) ratio of the signal processing circuit at the subsequent stage of the pixel circuit PXC. For the gate electrodes 20 other than the amplifying transistor SF, the ON/OFF switching rate of the gate is increased so that the operating speed of the pixel circuit PXC is increased.

An interlayer insulating film 17 is provided on the light shielding film 30. The interlayer insulating film 17 includes a plurality of contact holes, in which a plurality of contact plugs 40 are disposed. As illustrated in FIG. 2B, the plurality of contact plugs 40 include contact plugs 422, 423, 413, 424, 414, 425, 426, and 416. The contact plug 422 connects to the gate electrode 202. The contact plug 423 connects to the gate electrode 203. The contact plug 413 connects to the charge detection portion 103. The contact plug 424 connects to the gate electrode 204. The contact plug 414 connects to the semiconductor region 104. The contact plug 425 connects to the gate electrode 205. The contact plug 426 connects to the gate electrode 206, and the contact plug 416 connects to the semiconductor region 106. The contact plug 422 is disposed in the opening 302 of the light shielding film 30. The contact plugs 423, 413, 424, 414, and 425 are disposed in the opening 303 of the light shielding film 30. The contact plugs 426 and 416 are disposed in the opening 304 of the light shielding film 30. Thus, the openings 302, 303, and 304 of the light shielding film 30 are provided to dispose the contact plugs 40. Disposing the interlayer insulating film 17 between the contact plugs 40 and the light shielding film 30 in the openings 302, 303, and 304 ensures the insulation therebetween.

A wiring layer 50 is provided on the interlayer insulating film 17 and the contact plugs 40 (the contact plugs 422, 423, 413, 424, 414, 425, 426, and 416). The wiring layer 50 includes a plurality of wiring lines (a wiring pattern) connected to any of the contact plugs 422, 423, 413, 424, 414, 425, 426, and 416. The plurality of wiring lines of the wiring layer 50 include a wiring line (a local wiring line) connecting the contact plug 423 and the contact plug 425 together. The contact plugs 422, 413, 424, 414, 426, and 416 are connected to global wiring lines, such as a driving signal line, a power line, and a signal output line.

As illustrated in FIG. 2B, insulator layers are disposed on the upper surfaces of the gate electrodes 20. Specifically, the insulator layers include an insulator layer 212 on the gate electrode 202, an insulator layer 213 on the gate electrode 203, an insulator layer 214 on the gate electrode 204, an insulator layer 215 on the gate electrode 205, and an insulator layer 216 on the gate electrode 206. The insulator layers 212, 213, 214, 215, and 216 may be silicon oxide layers rather than silicon nitride layers to reduce the electrostatic capacitance between the gate electrodes 20 and the light shielding film 30. This is because the silicon oxide layer has a lower dielectric constant than that of the silicon nitride layer, which is advantageous in reducing the electrostatic capacitance. The insulator layers 212, 213, 214, 215, and 216 are, for example, from 10 nm to 100 nm in thickness, and preferably, from 10 nm to 50 nm in thickness. Disposing the insulator layers 212, 213, 214, 215, and 216 having a certain thickness or more increases the distance between the gate electrodes 20 and the light shielding film 30, thereby reducing the electrostatic capacitance between the gate electrodes 20 and the light shielding film 30. The insulator layers 212, 213, 214, 215, and 216 are each in contact with the upper surface of corresponding one of the gate electrodes 20 and are not in contact with the side surface. The insulator layers 212, 213, 214, 215, and 216 are patterned so as to have substantially the same width as the width of the upper surface of a corresponding gate electrode 20. The insulator layers 212, 213, 214, 215, and 216 are discontinuous to each other. Disposing the insulator layers 212, 213, 214, 215, and 216 discontinuously achieves both the reduction in electrostatic capacitance between the gate electrodes 20 and the light shielding film 30 and the light shielding performance of the light shielding film 30.

A dielectric layer 13 is disposed so as to contiguously cover the individual semiconductor regions of the semiconductor layer 10, the gate electrodes 202, 203, 204, 205, and 206, and the insulator layers 212, 213, 214, 215, and 216. The dielectric layer 13 may be a silicon nitride layer. The dielectric layer 13 is, for example, from 20 nm to 200 nm in thickness, and preferably, from 25 nm to 100 nm in thickness. The dielectric layer 13, which is a silicon nitride layer, plays various roles. The dielectric layer 13, which is a silicon nitride layer, has various roles. The dielectric layer 13 can include the function of preventing the metal in the light shielding film 30 from diffusing to the semiconductor layer 10. A part of the dielectric layer 13 located above the photoelectric conversion portion 101 can play the role of anti-reflection to reduce reflection of light incident on the photoelectric conversion portion 101. The dielectric layer 13 can serve as an etching stopper in forming contact holes in which the contact plugs 40 are to be disposed.

An insulator layer 12 is disposed between the dielectric layer 13 and the photoelectric conversion portion 101. The insulator layer 12 may be a silicon oxide layer. The insulator layer 12 may be thinner than the dielectric layer 13 and the insulator layers 212, 213, 214, 215, and 216. The insulator layer 12 is, for example, from 5 nm to 50 nm in thickness, and preferably, from 5 nm to 20 nm in thickness. The insulator layer 12 may also be disposed between the dielectric layer 13 and the charge holding portion 102, the charge detection portion 103, the semiconductor regions 104, 105, and 106, and the element isolation region 11. The insulator layer 12 can function as a buffer layer between the dielectric layer 13, which is a silicon nitride layer, and the semiconductor layer 10 and the gate electrodes 20. The insulator layer 12 may extend between the dielectric layer 13 and the insulator layers 212, 213, 214, 215, and 216 and between the dielectric layer 13 and the side surfaces of the gate electrodes 202, 203, 204, 205, and 206. The insulator layer 12 can be disposed between the dielectric layer 13 and the gate electrodes 202, 203, 204, 205, and 206 so as to continuously cover the gate electrodes 202, 203, 204, 205, and 206.

An insulator layer 14 is disposed between the dielectric layer 13 and the light shielding film 30. The insulator layer 14 may be a silicon oxide layer. The insulator layer 14 is, for example, from 20 nm to 80 nm in thickness. The insulator layer 14 can include the function of planarizing the ground of the light shielding film 30. For that purpose, the insulator layer 14 may be thicker than the insulator layers 212, 213, 214, 215, and 216.

As is apparent from FIG. 2B, the distance between a portion of the semiconductor layer 10 on which the gate electrodes 20 are not disposed and the light shielding film 30 corresponds to the thicknesses of the insulator layer and the dielectric layer between the surface of the semiconductor layer 10 and the light shielding film 30. The distance to the light shielding film 30 is a distance to the lower surface of the light shielding film 30. In this embodiment, the sum of the thickness of the dielectric layer 13 and the thickness of the insulator layer 14 agrees with the distance between the surface of the semiconductor layer 10 and the light shielding film 30. In the case where the insulator layer 12 extends also to the upper surface of the gate electrodes 20, the addition of the thickness of the insulator layer 12 thereto agrees with the distance between the surface of the semiconductor layer 10 and the light shielding film 30.

The distance between the dielectric layer 13 and the upper surface of the gate electrode 20 is greater than the distance between the dielectric layer 13 and the side surface of the gate electrode 20. The difference in distance comes from the thicknesses of the insulator layers 212, 213, 214, 215, and 216. In the case where the dielectric layer 13 is in contact with the side surface of the gate electrode 20, the distance between the dielectric layer 13 and the side surface of the gate electrode 20 is zero. In the case where the insulator layer 12 extends between the dielectric layer 13 and the gate electrode 20, the distance between the dielectric layer 13 and the side surface of the gate electrode 20 corresponds to the thickness of the dielectric layer 13.

FIG. 2B illustrates a distance D1 between the portion 311 of the light shielding film 30 covering the photoelectric conversion portion 101 and the semiconductor layer 10, a distance D2 between the portion 312 of the light shielding film 30 covering the charge holding portion 102 and the semiconductor layer 10, a distance D4 between the portion 315 of the light shielding film 30 covering the semiconductor region 105 and the semiconductor layer 10, and a distance D5 between the portion 316 of the light shielding film 30 covering the element isolation region 11 and the semiconductor layer 10. In this embodiment, the distances D1, D2, D4, and D5 are equal to one another and are collectively referred to as distance Dsub (Dsub=D1, D2, D4, and D5). The distance Dsub is preferably greater than zero (Dsub>0). This is for the purpose of suppressing contamination of the semiconductor layer 10 due to the metal component or the like of the light shielding film 30. Since the insulator layer 12, the dielectric layer 13, and the insulator layer 14 are located between the portions 311, 312, and 315 of the light shielding film 30 and the semiconductor layer 10, the distance Dsub corresponds to the sum of the thicknesses of the insulator layer and the dielectric layer. The distance Dsub is, for example, from 25 nm to 250 nm, and preferably, from 50 nm to 250 nm.

Similarly, the distance between the upper surface of the gate electrode 20 and a portion of the light shielding film 30 covering the gate electrode 20 corresponds to the thicknesses of the insulator layer and the dielectric layer between the upper surface of the gate electrode 20 and the light shielding film 30. FIG. 2B illustrates a distance D3 between the portion 325 of the light shielding film 30 covering the upper surface of the gate electrode 205 and the upper surface of the gate electrode 205. A distance Dgt between the upper surfaces of the plurality of gate electrodes 20, such as the gate electrodes 202, 203, 204, and 206, and the light shielding film 30 may be assumed to be equal to the distance D3 (Dgt=D3). The distance Dgt, for example, from 50 nm to 500 nm, and preferably, from 50 nm to 250.

The distance D3 between the portion 312 and the upper surface of the gate electrode 205 is greater than the distance D2 between the portion 312 and the semiconductor layer 10 (D2<D3). The difference between the distance D3 and the distance D2 comes from the thickness of the insulator layer 215. This reduces the parasitic capacitance generated in the gate electrode 205 and ensures high light shielding performance of the portion 312 for the charge holding portion 102.

The distance D3 between the portion 325 and the upper surface of the gate electrode 205 is greater than the distance D4 between the portion 315 that covers the semiconductor region 105 and the semiconductor layer 10 (D4<D3). The distance D5 between the portion 310 that covers the element isolation region 11 and the element isolation region 11 is less than the distance D3 between the portion 325 and the upper surface of the gate electrode 205 (D5<D3). The distance D1 between the portion 311 that covers the photoelectric conversion portion 101 and the semiconductor layer 10 is less than the distance D3 between the portion 325 and the upper surface of the gate electrode 205 (D1<D3). This reduces the parasitic capacitance generated in the gate electrode 205 and ensures high light shielding performance for the semiconductor region 105 covered by the portion 315, the element isolation region 11 covered by the portion 310, and the end of the photoelectric conversion portion 101 covered by the portion 311. This suppresses intrusion of light through the semiconductor region 105, the element isolation region 11, and the photoelectric conversion portion 101 into the charge holding portion 102, thus increasing the quality of images captured with the global electronic shutter.

The above description is about the distance D3 between the upper surface of the gate electrode 205 and the portion 325 of the light shielding film 30. The distance D3 preferably has the above relations because parasitic capacitance in the gate electrode 205 has a direct effect on the conversion factor in the charge-voltage conversion (V=Q/C). Parasitic capacitance in the gate electrodes 202, 203, 204, and 206 other than the gate electrode 205 can decrease the switching speed of the gates. For that reason, the distance Dgt between the upper surfaces of the gate electrodes 202, 203, 204, and 206 and the light shielding film 30 is also preferably greater than the distances D1, D2, D4, and D5 (Dgt>Dsub=D1, D2, D4, D5). The relation between the distances D1, D2, D4, and D5 and the distance Dgt also comes from the thicknesses of the insulator layers 212, 213, 214, 215, and 216, like the insulator layer 215 on the upper surface of the gate electrode 205.

The difference between the distance D3 between the portion 312 and the upper surface of the gate electrode 205 and the distance D1 between the portion 311 and the semiconductor layer 10 (D3−D1) is less than the thickness Tg (not illustrated) of the gate electrode 20, such as the gate electrode 205. Extremely large difference between the distance D3 and the distance D1 increases the difference in height of surface irregularities of the light shielding film 30, causing the light reflected from the light shielding film 30 to stray or step separation in the light shielding film 30. Setting the difference between the distance D3 and the distance D1 less than the thickness Tg of the gate electrode 20 allows the upper surface of the light shielding film 30 to have a satisfactory shape.

The distance between the semiconductor region 104, which is the source of the amplifying transistor SF, and the light shielding film 30 may also be less than the distance D3 from the upper surface of the gate electrode 205 as is the distance D4. The distance between the sources and drains of the other transistors and the light shielding film 30 may also be less than the distance between the gate electrodes of the transistors and the light shielding film 30.

Setting the distance Dgs between the portions 311, 312, and 315 of the light shielding film 30 and the side surface of the gate electrode 20 greater than the distances D1, D2, D4, and D5 is also effective in reducing the parasitic capacitance in the gate electrode 20. The distance Dgt may be less or greater than the distance Dgs. If the area of the upper surface of the gate electrode 20 is greater than the total area of the side surfaces of the gate electrode 20 (the sum of the areas of the four side surfaces), the distance Dgt may be greater than the distance Dgs. If the area of the upper surface of the gate electrode 20 is less than the total area of the side surfaces of the gate electrode 20, the distance Dgt may be less than the distance Dgs.

Satisfying the above relation, distance Dgt>distance Dsub, reduces the parasitic capacitance in the gate electrode 20 to enhance the performance of the pixel circuits PXC.

Another device for enhancing the performance of the pixel circuits PXC will be described. Since the opening 303 of the light shielding film 30 is located above the charge detection portion 103, the light shielding film 30 does not overlap with the charge detection portion 103 by an amount corresponding to the opening 303, thus reducing the parasitic capacitance of the light shielding film 30 to the charge detection portion 103. Likewise, since the opening 303 of the light shielding film 30 is located above the gate electrode 205, the light shielding film 30 does not overlap with the gate electrode 205 by an amount corresponding to the opening 303, thus reducing the parasitic capacitance of the light shielding film 30 to the gate electrode 205. This also applies to the fact that the opening 302 is located above the gate electrode 202 and the fact that the opening 304 is located above the gate electrode 206.

The gate electrode 205 can be connected to the charge detection portion 103 without the opening 303, in which case the gate electrode 205 is extended without using the contact plug 423 so that the gate electrode 205 is brought into contact with the charge detection portion 103. However, this increases the area of the overlap between the extended gate electrode 205 and the light shielding film 30, so that the parasitic capacitance cannot be sufficiently reduced. In the present embodiment, the contact plug 425 connected to the gate electrode 205 and the contact plug 423 connected to the charge detection portion 103 are disposed in the same opening 303. This is also effective in reducing the parasitic capacitance between the contact plugs 423 and 425 and the light shielding film 30, thereby reducing the capacitance of the charge detection capacitor FD.

Locating an end face of the light shielding film 30 defining the opening 303 above the upper surface of the gate electrode 205 provides a large light shielding area, thus improving the light shielding performance. Likewise, the end face of the light shielding film 30 defining the opening 303 is located also above the upper surfaces of the gate electrodes 203 and 204. An end face of the light shielding film 30 defining the opening 302 is located above the upper surface of the gate electrode 202, and an end face of the light shielding film 30 defining the opening 304 is located above the upper surface of the gate electrode 206.

Enhancing the light shielding performance of the semiconductor region other than the charge holding portion 102 is effective particularly when the semiconductor region other than the charge holding portion 102 is disposed near the photoelectric conversion portion 101. As illustrated in FIG. 2A, no transistor is disposed between the gate electrodes 204 and 205 and the photoelectric conversion portion 101. The gate electrode 203 is not located on at least one straight line connecting the gate electrodes 204 and 205 the gate electrode 202. Note that the cross-sectional view illustrated in FIG. 2B is a cross-sectional view taken along line IIB-IIB in FIG. 2A.

Referring to FIGS. 3A to 3F, a method for manufacturing the photoelectric conversion apparatus APR illustrated in FIGS. 2A and 2B will be described.

Figure 3A:
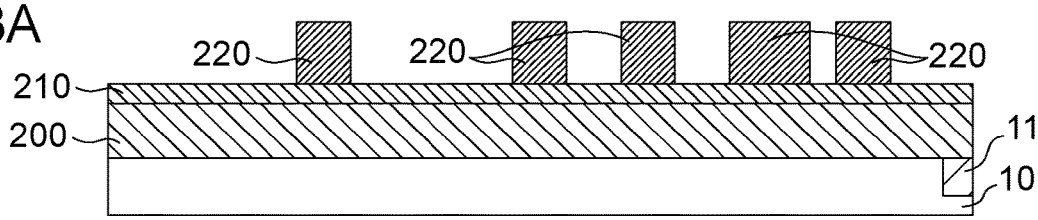
FIGS. 3A to 3F illustrate a method for manufacturing a photoelectric conversion apparatus.

In the process illustrated in FIG. 3A, an element isolation region (not illustrated) and a well region (not illustrated) are formed on a substrate (wafer) including the semiconductor layer 10. A gate insulator film (not illustrated) is formed on the semiconductor layer 10, and a conductor film 200 serving as the gate electrodes 20 is formed on the gate insulator film. Examples of the conductor film 200 include a polysilicon film and an amorphous silicon film. An insulator film 210, such as a silicon oxide film, is formed on the conductor film 200. A resist pattern 220 is formed on the insulator film 210 by photolithography.

Figure 3B:
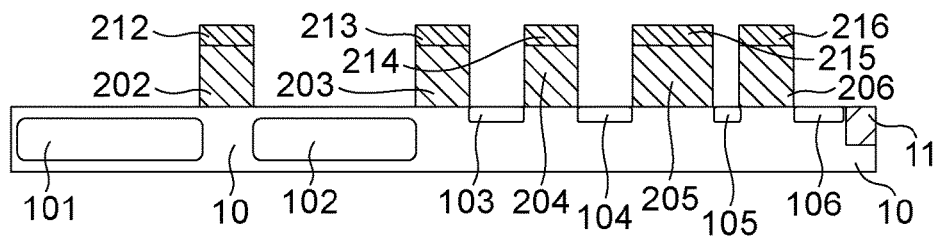

In the process illustrated in FIG. 3B, the insulator film 210 and the conductor film 200 are patterned by dry etching using the resist pattern 220 as a mask. Thus, the gate electrodes 20 (the gate electrodes 202, 203, 204, 205, and 206) and the insulator layers 212, 213, 214, 215, and 216 on the upper surface thereof are formed.

Figure 3C:
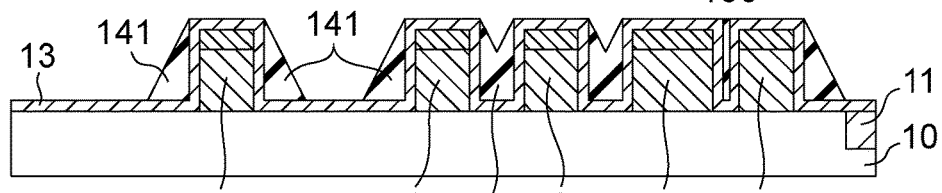

In the process illustrated in FIG. 3C, the insulator layer 12 (not illustrated), which is a silicon oxide layer, is formed on the entire surface, and the dielectric layer 13, which is a silicon nitride layer, is formed on the insulator layer 12. A silicon oxide film is formed on the dielectric layer 13, and the silicon oxide film is etched to form an insulator layer 141 serving as a side wall spacer that covers the side surfaces of the gate electrodes 20.

Figure 3D:
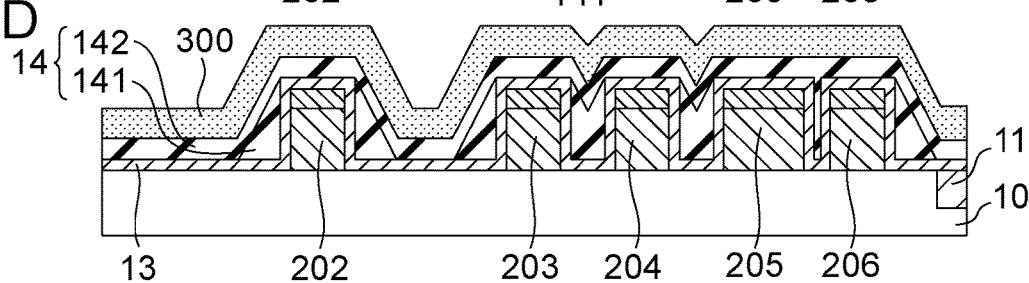

In the process illustrated in FIG. 3D, an insulator layer 142, which is a silicon oxide layer, is layered over the entire surface of the insulator layer 141. The insulator layer 141 and the insulator layer 142 form the insulator layer 14. Furthermore, a metal film 300, such as a tungsten film, is formed on the insulator layer 14. In the process in FIG. 3D, the insulator layer 141 can play the role of enhancing the coverage of the metal film 300 in forming the metal film 300.

Figure 3E:
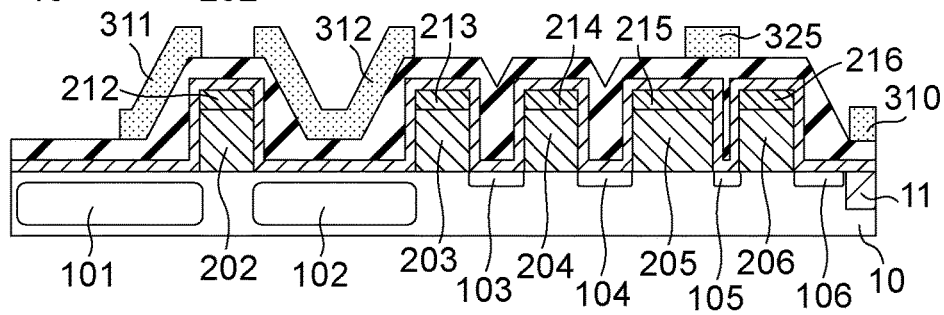

In the process illustrated in FIG. 3E, the metal film 300 is patterned by photolithography and dry etching to form the light shielding film 30 having predetermined openings. In the process in FIG. 3E, the insulator layer 142 can function as a protecting layer for preventing the dielectric layer 13 from being etched while the metal film 300 is subjected to dry etching. When the thickness of the dielectric layer 13 is changed due to dry etching, the reflection preventing performance of the dielectric layer 13 can be reduced, but disposing the insulator layer 14 (insulator layer 142) enhances the optical characteristics.

Figure 3F:
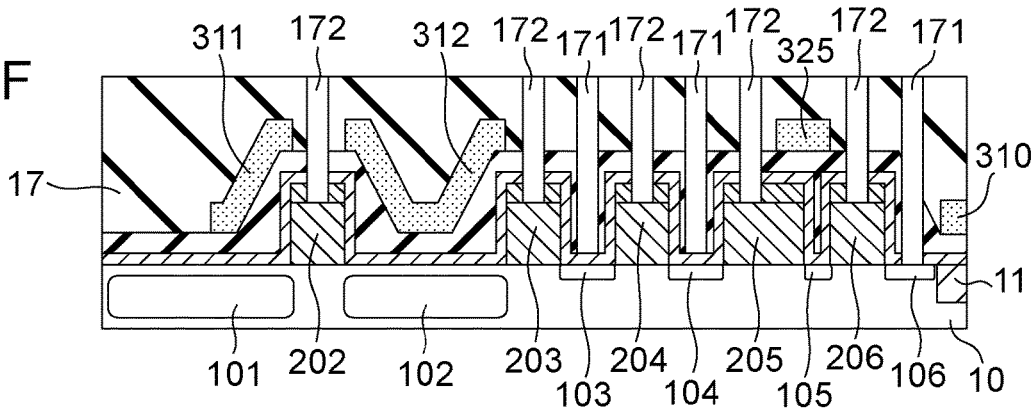

In the process illustrated in FIG. 3F, the interlayer insulating film 17, such as a silicon oxide film, is formed on the light shielding film 30, and the interlayer insulating film 17 is planarized as necessary. A plurality of contact holes 171 and 172 are formed in the interlayer insulating film 17. The contact holes 171 reach the semiconductor layer 10, and the contact holes 172 reach the gate electrode 20. The contact holes 172 pass through the insulator layers 212, 213, 214, 215, and 216. The dielectric layer 13 can function as a temporary etching stopper when the contact holes 171 and 172 are formed in the interlayer insulating film 17.

Thereafter, the contact plugs 40 are formed in the contact holes of the interlayer insulating film 17, the wiring layer 50 is formed, and an interlayer insulating film 19 is formed. Thereafter, a necessary number of wiring layers are formed. Furthermore, optical waveguides, color filters, and microlenses are formed as necessary.

The wafer is diced and packaged to manufacture the photoelectric conversion apparatus APR.

The photoelectric conversion apparatus APR of the present embodiment can be reduced in parasitic capacitance due to the light shielding film 30 of the gate electrodes 20 without sacrificing the light shielding performance on the charge holding portion 102. This reduces dark noise, thereby providing a photoelectric conversion apparatus APR with a high S/N ratio.

Second Embodiment

Referring to FIGS. 4A and 4B and FIGS. 5A to 5F, a second embodiment of the present disclosure will be described. In the second embodiment, only differences from the first embodiment will be described, and descriptions of points that can be the same as those of the first embodiment will be omitted.

Figure 4A:
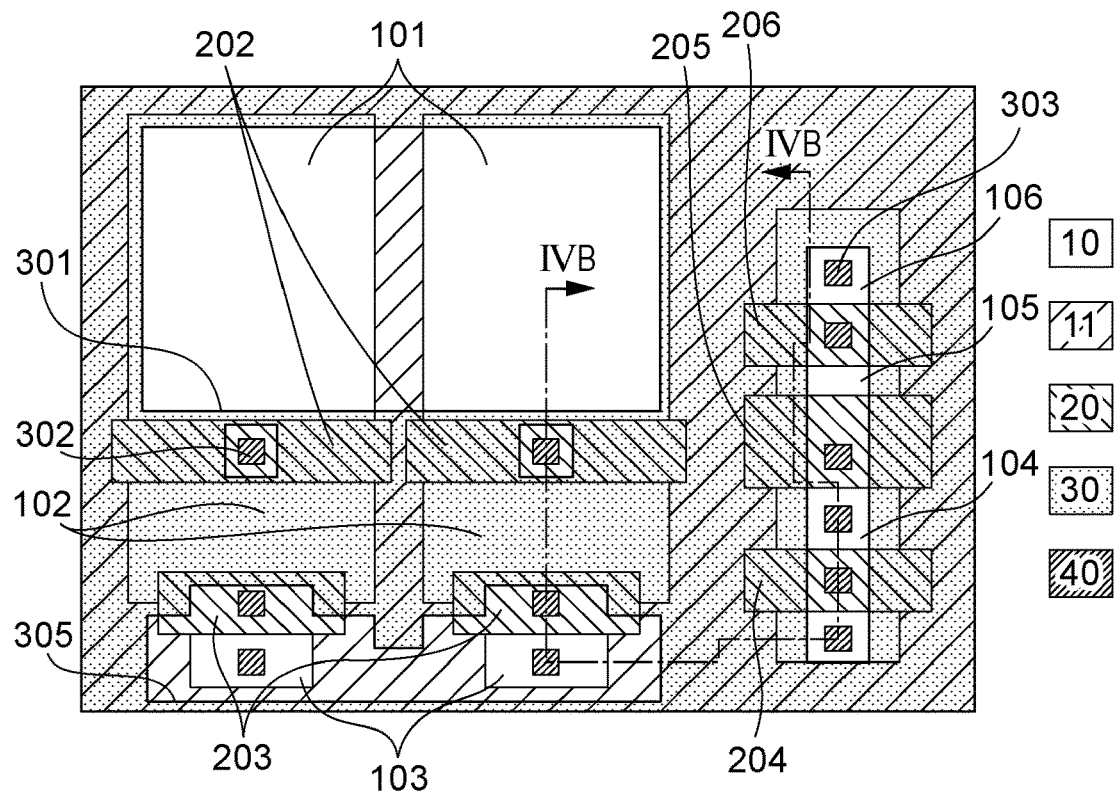
FIG. 4A is a schematic plan view of a pixel circuit according to a second embodiment of the present disclosure.
Figure 4B:
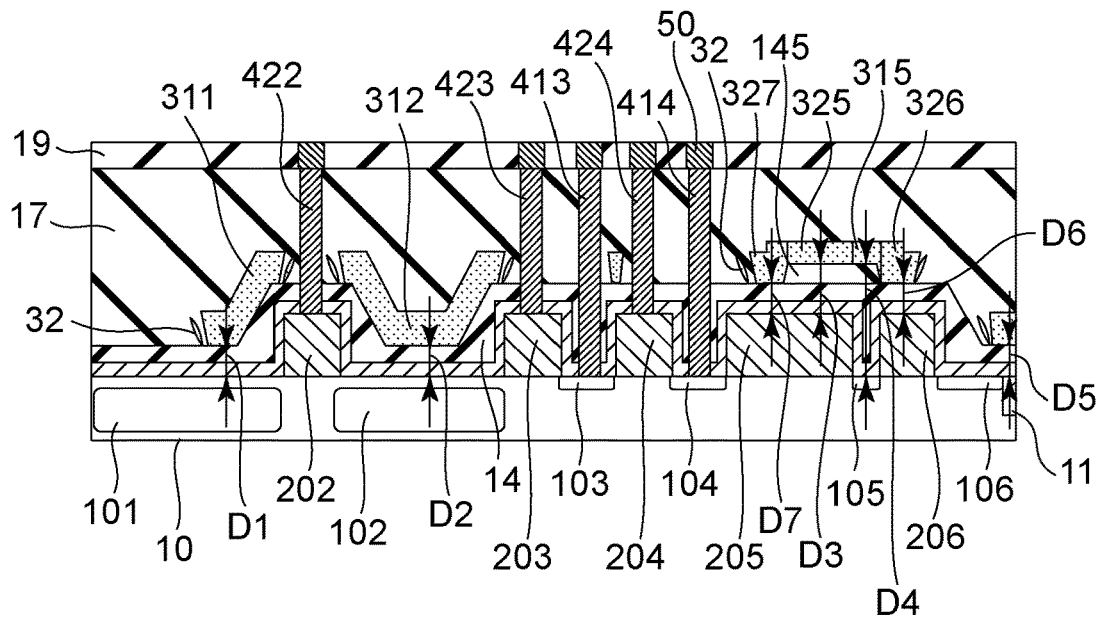
FIG. 4B is a schematic cross-sectional view of the pixel circuit taken along line IVB-IVB in FIG. 4A.

FIG. 4A is a schematic plan view of a pixel circuit PXC, and FIG. 4B is a schematic cross-sectional view of the pixel circuit PXC taken along line IVB-IVB in FIG. 4A. FIG. 2A illustrates a pixel circuit PXC corresponding to one pixel. Legends illustrating the correspondence relationship between hatching and signs are illustrated at the right of FIG. 4A and the lower part of FIG. 4B. FIG. 4A illustrates how a plurality of members overlap using overlaps of the hatched portions.

In the present embodiment, one pixel includes a plurality of photoelectric conversion portions 101, a plurality of charge holding portions 102, and a plurality of charge detection portions 103. Disposing the plurality of photoelectric conversion portions 101 in one pixel enables focus detection and increasing the dynamic range. An opening 301 of the light shielding film 30 is disposed across the plurality of photoelectric conversion portions 101. An opening 305 of the light shielding film 30 is disposed across the plurality of charge detection portions 103. The opening 305 houses a plurality of contact plugs 40 including a contact plug 413 connected to the charge detection portion 103. An opening 303 of the light shielding film 30 is disposed across the gate electrodes 204, 205, and 206. The opening 303 houses a plurality of contact plugs 40 including a contact plug connected to the gate electrode 205. Unlike the first embodiment, the opening 305 is provided separately from the opening 303. This increases the flexibility of the pattern of the light shielding film 30, thereby increasing the size of the opening 305 above the charge detection portion 103. This can reduce the parasitic capacitance in the charge detection portion 103 due to the light shielding film 30.

In the present embodiment, an insulator layer corresponding to the insulator layer 215 in the first embodiment is not provided. However, the insulator layer 14 is varied in thickness so as to have a protrusion 145 above the gate electrode 205. This increases the distance D3 by an amount corresponding to the height of the protrusion 145. Consequently, also in the present embodiment, the distance D3 between the portion 325 of the light shielding film 30 covering the gate electrode 205 and the gate electrode 205 is greater than the distance D1, D2, D5 (D1, D2, and D3<D5). This can decrease the capacitance of the gate electrode 205.

In the present embodiment, the light shielding film 30 can include a portion 327 that covers a second portion of the gate electrode 205, in addition to the portion 325 that covers a first portion of the gate electrode 205. The portion 327 is closer to the opening 303 than the portion 325 is. A distance D7 between the portion 327 and the upper surface of the gate electrode 205 is less than the distance D3 (D7<D3). Thus, disposing the light shielding film 30 (the portion 327) close to the gate electrode 205 in the vicinity of the opening 303 can reduce light incident from the opening 303. The distance D3 is, for example, 1.5 times or more and 3 times or less than the distance D7. The width of the portion 327 may be as small as possible from the viewpoint of reducing the parasitic capacitance. The width of the portion 327 away from the upper surface of the gate electrode 205 by the distance D7 may be less than the width of the portion 325 away from the upper surface of the gate electrode 205 by the distance D3. When emphasis is placed on capacitance reduction rather than light shielding performance, the portion 327 at the distance D7, which is less than the distance D3, may not be provided. This applies not only to the portion that covers the gate electrode 205 but also to a portion of the light shielding film 30 covering another gate electrode 20. For example, the distance D6 between a portion 326 of the light shielding film 30 covering the gate electrode 206 and the gate electrode 206 is also less than the distance D3. The distances between the upper surfaces of the gate electrodes 202, 203, and 204 and the light shielding film 30 may be the same as the distance D6. The distance D1 and the distance D2 may be the same as or different from the distance D6 and the distance D7. However, the distance D1 and the distance D2 are preferably less than the distance D6 and the distance D7 to achieve both increasing the light shielding performance for the semiconductor layer 10 and decreasing the parasitic capacitance in the gate electrode 20 (D1, D2<D6, D7).

In the present embodiment, the light shielding film 30 has uneven thickness distribution. The portion 325 covering the gate electrode 205, described above, is thinner than other portions 311, 312, 327, and 326. To increase the sensitivity of the photoelectric conversion apparatus APR, reduction in the distance between the wiring layer 50 and the semiconductor layer 10 (reduction in height) is effective. However, the portion 325 disposed away from the gate electrode 205 by the distance D3 in order to reduce the parasitic capacitance can be an obstacle to the reduction in height. In the present embodiment, the interlayer insulating film 17 can be decreased in thickness by decreasing the thickness of the portion 325 disposed away from the gate electrode 205 by the distance D5, thereby increasing the sensitivity by decreasing the height.

In the present embodiment, the distance between the gate electrode 205 and the gate electrode 206 is small, between which the dielectric layer 13 and the insulator layer 14 are embedded. Therefore, the portion 315 of the light shielding film 30 covering the semiconductor region 105, which is the source of the amplifying transistor SF, is not located between the gate electrode 205 and the gate electrode 206. As a result, the distance D3 between the portion 325 and the upper surface of the gate electrode 205 is less than the distance D4 between the portion 315 and the semiconductor layer 10 (D3<D4). Furthermore, the distance D4 is greater than the thickness Tg of the gate electrode 205. This can reduce the parasitic capacitance between the side surface of the gate electrode 205 and the light shielding film 30. The distance between the semiconductor region 104, which is the source of the amplifying transistor SF, and the light shielding film 30 may also be greater than the distance D3 between the portion 325 and the upper surface of the gate electrode 205, like the distance D4. The distance between the sources or the drains of the other transistors and the light shielding film 30 may also greater than the distance between the gate electrodes of the transistors and the light shielding film 30.

In the present embodiment, the end faces of the light shielding film 30 are inclined toward the semiconductor layer 10. This can reduce the parasitic capacitance between the light shielding film 30 at its ends and the gate electrode 20 or the semiconductor layer 10 while providing the same light shielding area in plan view.

In the present embodiment, a gap 32 is provided between part of the interlayer insulating film 17 that covers the light shielding film 30 and each end face of the light shielding film 30. The gap 32, which is a low refraction area, functions as a light barrier, so that intrusion of light through an opening of the light shielding film 30 defined by the end face of the light shielding film 30 can be reduced. Furthermore, providing the gap 32, which is a low-permittivity region, can reduce the parasitic capacitance between the end face of the light shielding film 30 and the semiconductor layer 10 or the gate electrode 20.

Referring to FIGS. 5A to 5F, a method for manufacturing the photoelectric conversion apparatus APR illustrated in FIGS. 3A to 3F.

Figure 5A:
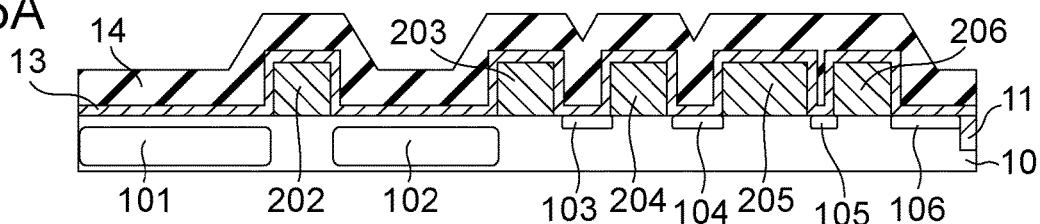
FIGS. 5A to 5F illustrate a method for manufacturing a photoelectric conversion apparatus according to a second embodiment of the present disclosure.

The process illustrated in FIG. 5A can be performed in the same way as the formation of the insulator layer 14 in the process illustrated in FIG. 3D. The insulator layers 212, 213, 214, 214, and 215 in the processes illustrated in FIGS. 3A and 3B can be omitted.

Figure 5B:
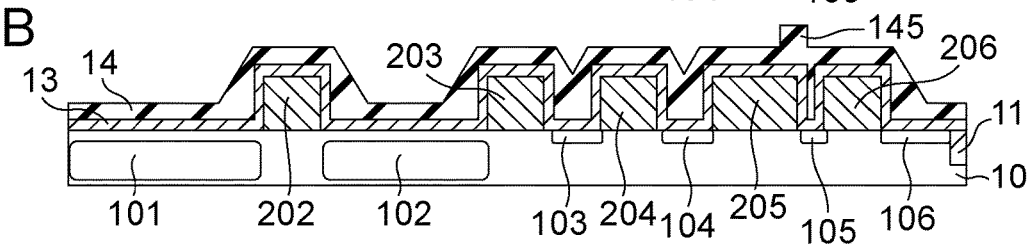

In the process illustrated in FIG. 5B, a portion of the insulator layer 14 located above the gate electrode 205 is masked, and the other portion of the insulator layer 14 is etched to form a protrusion 145 on the insulator layer 14. The protrusion 145 is located above the gate electrode 205.

Figure 5C:
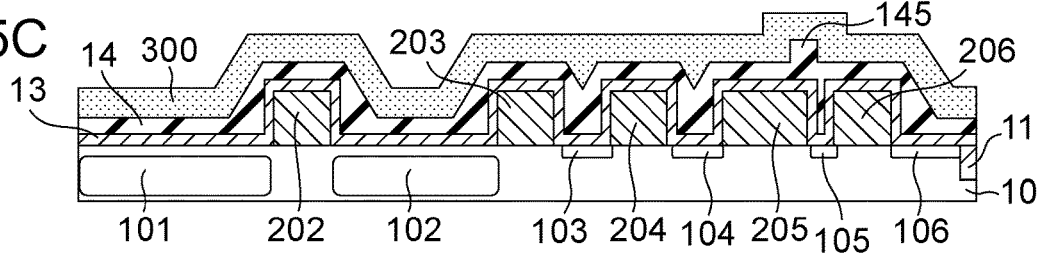

In the process illustrated in FIG. 5C, the metal film 300 is formed as in the process illustrated in FIG. 3D. The metal film 300 covers the protrusion 145.

Figure 5D:
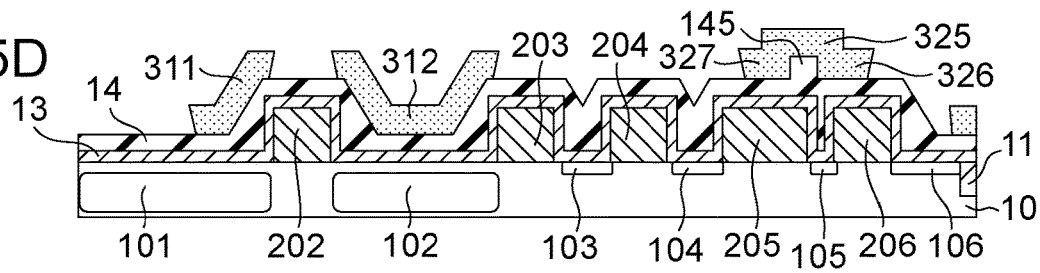

In the process illustrated in FIG. 5D, the metal film 300 is patterned to form the light shielding film 30 including predetermined openings, as in the process illustrated in FIG. 3E. At that time, the end faces of the light shielding film 30 can be inclined toward the semiconductor layer 10 by adjusting conditions for dry etching of the metal film 300. In the case where the portion 327 is to be formed at the light shielding film 30, as illustrated in FIG. 4B, the width of the mask above the gate electrode 205 when the metal film 300 is patterned is set larger than the width of the protrusion 145. In the case where the portion 327 is not to be formed, the width of the mask above the gate electrode 205 when the metal film 300 is patterned is set less than the width of the protrusion 145. Thus, the metal film 300 can be formed in conformity with the ground. This causes the metal film 300 in the direction of the normal to the upper surface of the gate electrode 205 to be thicker than the portion 325 and the portion 327 along the boundary between the portion 325 and the portion 327 located within a predetermine range from the protrusion 145. The width of the boundary portion roughly agrees with the thickness of the metal film 300, and the thickness of the boundary portion agrees with the sum of the height of the protrusion 145 and the thickness of the metal film 300. Since each end face of the light shielding film 30 is formed of the boundary portion, high end faces can be provided.

Figure 5E:
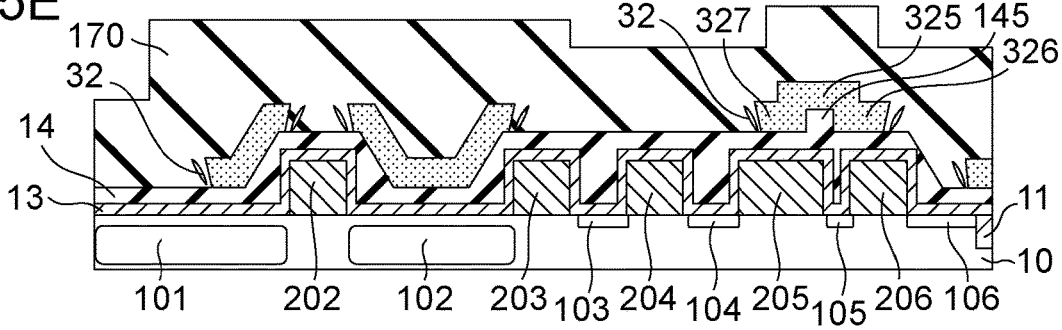

In the process illustrated in FIG. 5E, a first interlayer insulating film 170 is formed on the light shielding film 30. Since the end faces of the light shielding film 30 are inclined, the light shielding film 30 itself can form flanges. Thus, the gaps 32 are formed at positions of the first interlayer insulating film 170 facing the end faces of the light shielding film 30 by adjusting the conditions for forming the first interlayer insulating film 170.

Figure 5F:
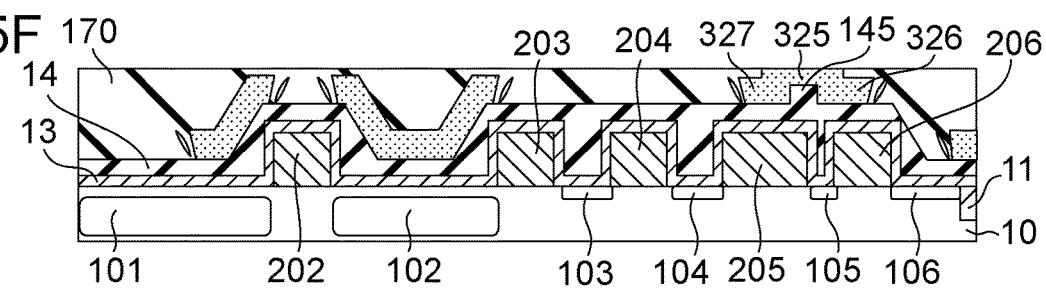

In the process illustrated in FIG. 5F, the first interlayer insulating film 170 is planarized using a polishing method, such as a chemical mechanical polishing (CMP) method. At that time, the interlayer insulating film 170 is polished until the portion 325 of the light shielding film 30 is exposed, and furthermore, the interlayer insulating film 170 and the light shielding film 30 are polished so that the portion 325 becomes thin. This can make the portion 325 of the light shielding film 30 thinner than the portion 327. In the case where the portion 325 is not to be made thin, the first interlayer insulating film 170 is planarized so as to be left on the portion 325.

Thereafter, a second interlayer insulating film (not illustrated) is formed on the first interlayer insulating film 170. The second interlayer insulating film is formed in order to suppress exposure of the portion 325 of the light shielding film 30. When the portion 325 is not exposed, the second interlayer insulating film may not be formed. The first interlayer insulating film 170 and the second interlayer insulating film are layered to form the interlayer insulating film 17 illustrated in FIG. 4B. Thereafter, contact holes 171 and 172 are formed in the interlayer insulating film 17, as in the process illustrated in FIG. 3F. After the contact plugs 40 are formed in the contact holes 171 and 172, an interlayer insulating film 19 is formed. Trenches are formed in the interlayer insulating film 19. The trenches are filled with a conductive material, such as copper, and an excessive conductive material outside the trenches is removed by polishing. Thus, the wiring layer 50 is formed by a single damascene method. Thereafter, a necessary number of wiring layers are formed. Furthermore, optical waveguides, color filters, and microlenses are formed as necessary.

The present embodiment can more effectively improve the light shielding performance and reduce the parasitic capacitance than the first embodiment.

The equipment EQP illustrated in FIG. 1A will be described in detail. The photoelectric conversion apparatus APR can include a semiconductor device IC including the semiconductor layer 10 and a package PKG for housing the semiconductor device IC. The package PKG can include a base member to which the semiconductor device IC is fixed, a cover member, such as glass, facing the semiconductor device IC, and a connecting member, such as a bonding wire or a bump, connecting a terminal provided on the base member and a terminal provided on the semiconductor device IC together.

The equipment EQP can further include at least any of an optical system OPT, a control unit CTRL, a processing unit PRCS, a display unit DSPL, and a memory MMRY. The optical system OPT is used to form an image on the photoelectric conversion apparatus APR, for example, a lens, a shutter, and a mirror. The control unit CTRL is used to control the photoelectric conversion apparatus APR, for example, a photoelectric conversion apparatus, such as an application specific integrated circuit (ASIC). The processing unit PRCS is used to process signals output from the photoelectric conversion apparatus APR, for example, a CPU or an ASIC constituting an analog front end (AFE) or a digital front end (DFE). The display unit DSPL is an electro-luminescence (EL) display unit or a liquid-crystal display unit that displays information (images) acquired by the photoelectric conversion apparatus APR. The memory MMRY is a magnetic device or a semiconductor device that stores the information (images) acquired by the photoelectric conversion apparatus APR. The memory MMRY is a volatile memory, such as a SRAM or a DRAM, or a non-volatile memory, such as a flash memory or a hard disk drive. The mechanical unit MCHN includes a moving unit or a driving unit, such as a motor or an engine. The equipment EQP displays signals output from the photoelectric conversion apparatus APR on the display unit DSPL or transmits the signals to the outside with a communication unit (not illustrated) provided in the equipment EQP. For that purpose, the equipment EQP may include the memory MMRY and the processing unit PRCS in addition to a storage circuit and an operating circuit provided in the photoelectric conversion apparatus APR.

The equipment EQP illustrated in FIG. 1A can be electronic equipment, such as an information terminal including a shooting function (for example, a smartphone or a wearable terminal) or a camera (for example, an interchangeable lens camera, a compact camera, a video camera, or a surveillance camera). The mechanical unit MCHN of the camera can drive the parts of the optical system OPT for zooming, focusing, and shutter operations. The equipment EQP can be transport equipment, such as a vehicle, a vessel, or an air vehicle. The mechanical unit MCHN of the transport equipment can be used as a moving unit. The equipment EQP serving as transport equipment is suitable to transport the photoelectric conversion apparatus APR or to assist and/or automate the driving (controlling) using a shooting function. The processing unit PRCS for assisting and/or automating the driving (controlling) can perform a process for operating the mechanical unit MCHN serving as a moving unit on the basis of information acquired by the photoelectric conversion apparatus APR.

Using the photoelectric conversion apparatus APR according to the present embodiment can improve the quality of images acquired by the global electronic shutter. This enables high image quality and measurement accuracy to be achieved when the photoelectric conversion apparatus APR mounted in transport equipment is used to capture an image outside the transport equipment or measure the external environment. Furthermore, this increases the reliability so that the photoelectric conversion apparatus APR can be mounted in the transport equipment. Therefore, mounting the photoelectric conversion apparatus APR of the present embodiment in transport equipment when manufacturing and selling the transport equipment is advantageous in improving the performance of the transport equipment.

The embodiments described above can be changed as appropriate without departing from the technical spirit. It is to be understood that the disclosed content of the embodiments includes not only what is specified in the specification but also all matters that can be grasped from the specification and the drawings attached hereto.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2017-120763 filed Jun. 20, 2017, which is hereby incorporated by reference herein in its entirety.

What is claimed is:

1. A photoelectric conversion apparatus comprising:
a semiconductor layer including a photoelectric conversion portion, a charge holding portion configured to hold electric charge generated in the photoelectric conversion portion, and a charge detection portion to which the electric charge held by the charge holding portion is transferred;
a gate electrode of an amplifying transistor, the gate electrode being disposed on the semiconductor layer and having an upper surface and a side face;
a first contact plug connected to the gate electrode;
a second contact plug connected to the charge detection portion; and
a light shielding film including a first portion covering the charge holding portion, a second portion covering the upper surface of the gate electrode, and a first opening located above the charge detection portion,
wherein a distance between the second portion and the upper surface is greater than a distance between the first portion and the semiconductor layer, and
wherein the first contact plug and the second contact plug are disposed in the first opening of the light shielding film.

2. The photoelectric conversion apparatus according to claim 1, wherein the gate electrode is connected to the charge detection portion, and the semiconductor layer includes a semiconductor region which functions as a source or a drain of the transistor and also functions as a source or a drain of another transistor.

3. The photoelectric conversion apparatus according to claim 2,
wherein the light shielding film includes a third portion covering a source or a drain of the transistor, and
wherein the distance between the second portion and the upper surface is less than a distance between the third portion and the semiconductor layer.

4. The photoelectric conversion apparatus according to claim 1,
wherein the light shielding film includes a third portion covering a source or a drain of the transistor, and
wherein the distance between the second portion and the upper surface is greater than a distance between the third portion and the semiconductor layer.

5. A photoelectric conversion apparatus comprising:
a semiconductor layer including a photoelectric conversion portion, a charge holding portion configured to hold electric charge generated by the photoelectric conversion portion, and a charge detection portion to which the electric charge held by the charge holding portion is transferred;
a gate electrode of an amplifying transistor, the gate electrode being disposed on the semiconductor layer and connected to the charge detection portion;
a first contact plug connected to the gate electrode;
a second contact plug connected to the charge detection portion; and
a light shielding film including a first portion covering the charge holding portion, a second portion covering an upper surface of the gate electrode, a third portion covering a source or a drain of the transistor, and a first opening located above the charge detection portion,
wherein a distance between the second portion and the upper surface is greater than a distance between the third portion and the semiconductor layer, and
wherein the first contact plug and the second contact plug are disposed in the first opening of the light shielding film.

6. The photoelectric conversion apparatus according to claim 4,
wherein the light shielding film includes a fourth portion covering an element isolation region, and
wherein a distance between the fourth portion and the element isolation region is less than the distance between the second portion and the upper surface.

7. The photoelectric conversion apparatus according to claim 1,
wherein the light shielding film includes a fifth portion covering part of the photoelectric conversion portion,
wherein a distance between the fifth portion and the semiconductor layer is less than the distance between the second portion and the upper surface, and
wherein a difference between
(1) the distance between the second portion and the upper surface and
(2) the distance between the fifth portion and the semiconductor layer
is less than a thickness of the gate electrode.

8. The photoelectric conversion apparatus according to claim 1,
wherein the light shielding film includes a sixth portion covering an upper surface of the gate electrode, and
wherein a distance between the sixth portion and the upper surface is less than the distance between the second portion and the upper surface.

9. The photoelectric conversion apparatus according to claim 1,
wherein a first silicon oxide layer, a second silicon oxide layer, and a silicon nitride layer between the first silicon oxide layer and the second silicon oxide layer are disposed between the second portion and the upper surface, and
wherein a distance between the silicon nitride layer and the upper surface of the gate electrode is greater than a distance between the silicon nitride layer and the side surface of the gate electrode.

10. The photoelectric conversion apparatus according to claim 1, wherein an end face of the light shielding film is located above the upper surface of the gate electrode.

11. The photoelectric conversion apparatus according to claim 2, wherein an end face of the light shielding film is inclined toward the semiconductor layer.

12. The photoelectric conversion apparatus according to claim 1, wherein a gap is provided between part of an insulating film covering the light shielding film and an end face of the light shielding film.

13. The photoelectric conversion apparatus according to claim 1, wherein the light shielding film includes a second opening located above the photoelectric conversion portion.

14. The photoelectric conversion apparatus according to claim 13,
wherein a first transfer electrode is provided on a semiconductor region between the photoelectric conversion portion and the charge holding portion,
a third contact plug is connected to the first transfer electrode,
wherein the light shielding film includes a third opening, and
wherein the third contact plug is disposed in the third opening.

15. The photoelectric conversion apparatus according to claim 14,
wherein a second transfer electrode is provided on a semiconductor region between the charge holding portion and the charge detection portion.

16. The photoelectric conversion apparatus according to claim 15, wherein the second transfer electrode is not located along a straight line connecting the gate electrode and the first transfer electrode.

17. The photoelectric conversion apparatus according to claim 2,
wherein the charge holding portion includes an n-type semiconductor region, and
wherein a p-type semiconductor region is disposed between the n-type semiconductor region and a surface of the semiconductor layer.

18. An electronic apparatus comprising the photoelectric conversion apparatus according to claim 1, the electronic apparatus further comprising at least one of:
an optical system configured to form an image on the photoelectric conversion apparatus;
a control unit configured to control the photoelectric conversion apparatus;
a processing unit configured to process a signal output from the photoelectric conversion apparatus;
a display unit configured to display information obtained by the photoelectric conversion apparatus; and
a memory configured to store the information obtained by the photoelectric conversion apparatus.

19. A transport apparatus comprising a moving unit, the transport apparatus further comprising:
a photoelectric conversion apparatus; and
a processing unit configured to perform a process for operating the moving unit based on information obtained by the photoelectric conversion apparatus,
wherein the photoelectric conversion apparatus comprises:
a semiconductor layer including a photoelectric conversion portion, a charge holding portion configured to hold electric charge generated in the photoelectric conversion portion, and a charge detection portion to which the electric charge held by the charge holding portion is transferred;
a gate electrode of an amplifying transistor, the gate electrode being disposed on the semiconductor layer and having an upper surface and a side face;

a first contact plug connected to the gate electrode;
a second contact plug connected to the charge detection portion; and
a light shielding film including a first portion covering the charge holding portion, a second portion covering the upper surface of the gate electrode, and a first opening located above the charge detection portion,
wherein a distance between the second portion and the upper surface is greater than a distance between the first portion and the semiconductor layer, and
wherein the first contact plug and the second contact plug are disposed in the first opening of the light shielding film.

* * * * *